United States Patent [19]
Nolan

[11] Patent Number: 5,273,158
[45] Date of Patent: Dec. 28, 1993

[54] PACKAGE FOR STORING AND TRANSPORTING ELECTRONIC COMPONENTS

[76] Inventor: John B. Nolan, 700 Rudder Rd., Naples, Fla. 33940

[21] Appl. No.: 979,330

[22] Filed: Nov. 20, 1992

[51] Int. Cl.5 ............... B65D 81/04; B65D 73/02
[52] U.S. Cl. ........................... 206/330; 206/331
[58] Field of Search ............................ 206/330, 331

[56] References Cited

U.S. PATENT DOCUMENTS

| | | |
|---|---|---|
| 2,839,188 | 6/1958 | Cipriani et al. |
| 4,004,688 | 1/1977 | Braden ............... 206/330 |
| 4,165,807 | 8/1979 | Yagi ............... 206/330 X |
| 4,657,137 | 4/1987 | Johnson ............ 206/330 X |
| 4,711,351 | 12/1987 | Zucker et al. ........ 206/331 |
| 5,041,319 | 8/1991 | Becker et al. ........ 206/331 |

FOREIGN PATENT DOCUMENTS 152680  6/1990  Japan ................ 206/331

*Primary Examiner*—William I. Price
*Attorney, Agent, or Firm*—Merrill N. Johnson

[57] ABSTRACT

A package for storing and transporting small electronic components. The package is fabricated from flexible polyurethane foam in a rectangular shape which can be roled up into an elongated cylinder and secured in the clyndrical form by a strap or belt encircling the middle of the cylindrical package. When the strap or belt is unfastened, the flexible backing sheet will resume its normal flat rectangular form and the electronic components partially inserted into the compartments formed by plastic foam strips will be readily available for removal and use. The package is light and easy to carry from jobsite to jobsite. This component carrier prevents bending of the terminal wires of the stored electronic components by immobilizing the components and isolating them from each other to prevent injury and accumulation of electrostatic charges which could damage some electronic components. To prevent electrostatic buildup, the package is preferably fabricated of plastic foam made electrically conductive by loading it with carbon or aluminium.

3 Claims, 1 Drawing Sheet

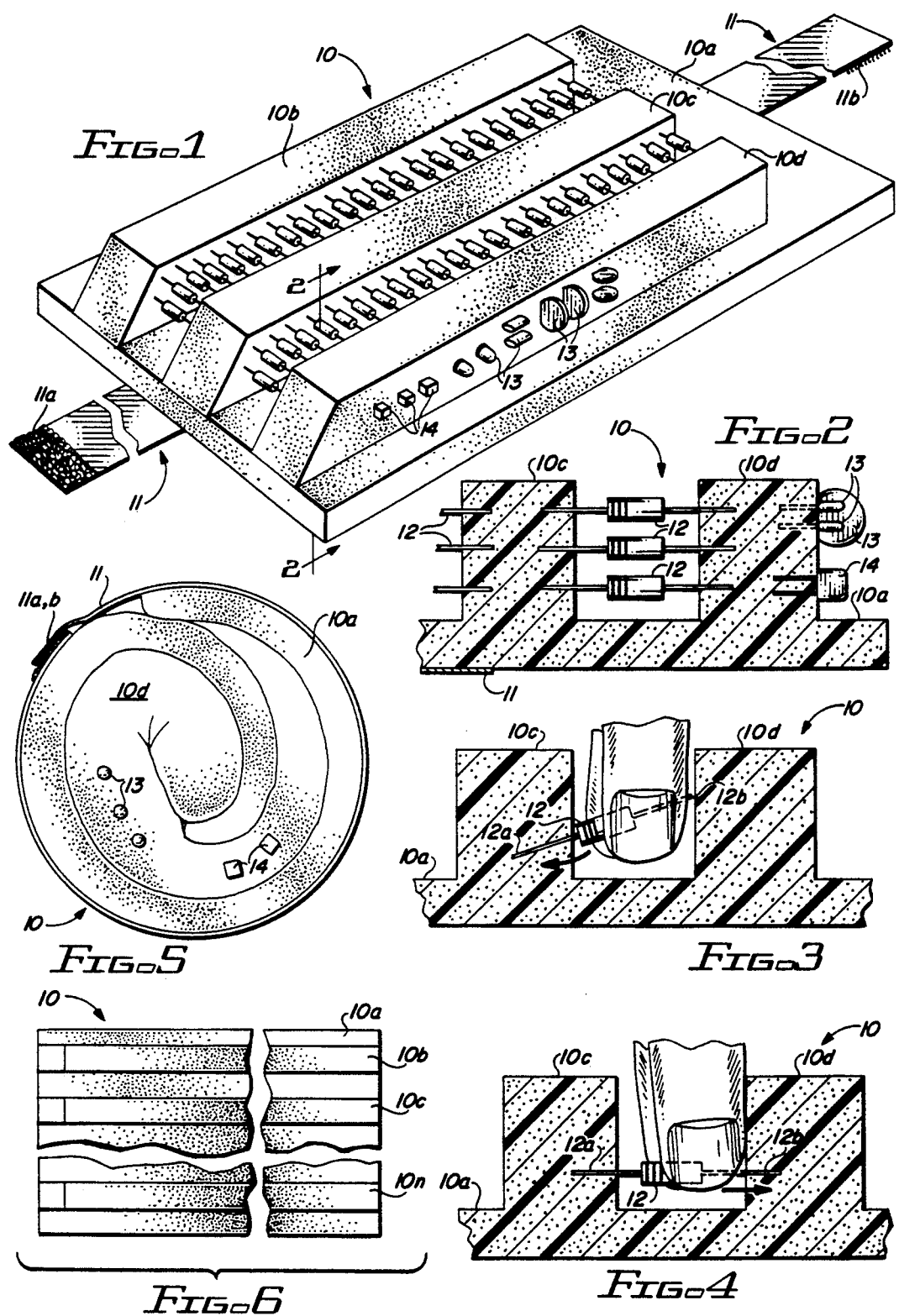

PACKAGE FOR STORING AND TRANSPORTING ELECTRONIC COMPONENTS

BACKGROUND AND SUMMARY OF THE INVENTION

My invention pertains to a package for conveniently and safely storing, transporting and dispensing a plurality of separate small electronic components such as capacitors, resistors, diodes, transistors and integrated circuits.

The technicians who install, service and repair electronic equipment traditionally carry with them to the jobsite a selection of electronic components in addition to their tools needed to install, service or repair the electronic unit. The electronic components are normally carried to the jobsite in the drawers and/or bins of a box.

On the jobsite as the technician needs a particular component, he must open the box, find the right bin or drawer, open it and extract the component from the jumble of similar components stored in the bin or drawer.

As an electronic serviceman for fifteen years, I became dissatisfied with the use of a heavy box to store and transport electronic components to the jobsite. Moreover, the practice of storing a quantity of similar components in a drawer or bin results in bending and deformation of the terminal wires of the electronic components. Also, movement of the components within the box can generate the buildup of electrostatic charges which can damage sensitive electronic components such as integrated circuit chips.

First of all, I wanted a component carrier that was light and easy to carry to the jobsite. Secondly, I wanted a component carrier that would prevent bending of the terminal wires of the stored electronic components. Finally, I wanted to immobilize the components and isolate them from each other to prevent their injury and the accumulation of electrostatic charges which could damage some of the electronic components.

My package for storing and transporting small electronic components is made of a flexible foam such as polyurethane. In order to prevent electrostatic buildup, the package is preferably made of plastic foam made electrically conductive by loading it with carbon or aluminium.

The flexible foam package is preferably molded or glued together. It includes a rectangular backing sheet and two or more spaced apart parallel plastic foam strips which project from the upper surface of the backing sheet. The terminals of the electronic components to be stored and transported are inserted into one or two of these plastic foam strips which securely hold the electronic components and isolate them from each other.

The plastic foam strips are shaped and located on the backing sheet to permit the entire package to be rolled up into an elongated cylinder and secured in this cylindrical form by a strap or belt encircling the middle of the cylindrical package.

When the strap or belt is unfastened, the flexible backing sheet will resume its normal flat rectangular form and the electronic components partially inserted into the plastic foam strips will be readily available for removal and use.

BRIEF DESCRIPTION OF THE DRAWINGS

For a full understanding of my invention, reference is made to the accompanying drawings in which:

FIG. 1 is a perspective view of a preferred form of my package containing a representative sample of electronic components;

FIG. 2 is a cross-sectional view partially broken away taken along line 2—2 of FIG. 1 showing a number of electronic components partially inserted into my package;

FIGS. 3 and 4 are cross-sectional views showing the technique of insertion of the terminals of a resistor into the plastic foam package;

FIG. 5 illustrates the package in its rolled-up form and secured by an encircling and fastened strap; and FIG. 6 is a top plan view illustrating an alternative form of my package containing more than two spaced apart parallel plastic foam strips projecting from the backing sheet.

DESCRIPTION OF THE PREFERRED EMBODIMENTS

Referring first to FIG. 1, a package 10 for storing and transporting electronic components includes a rectangular backing sheet 10a and three identical plastic foam strips 10b, 10c and 10d projecting in spaced apart and parallell relationship from the upper surface of backing sheet 10a.

The entire package 10 is molded and consists of flexible polyurethane foam loaded with a conductive material such as carbon or aluminium.

The three plastic foam strips 10b, 10c and 10d are so sized and located on the upper surface of backing sheet 10a that the entire package 10 can be conveniently rolled up into an elongated cylinder as shown in FIG. 5 and secured in that cylindrical form for convenient storage and transportation by means of strap 11.

Strap 11 contains at its opposite ends strips of Velcro ® 11a and 11b which when pressed together locks package 10 in its rolled-up form as shown in FIG. 5. When strap is unlocked by separating strips 11a and 11b, package 10 will quickly resume its normal form with backing sheet 10a regaining its flat rectangular form and the electronic components 12, 13 and 14 partially inserted into plastic foam strips 10b, 10c and 10d will be exposed for removal and use by the technician.

The electronic components storable in my flexible plastic foam package include capacitors, resistors, diodes, transistors and integrated circuits. Shown in FIGS. 1 and 2 are a number of resistors 12, integrated circuit chips 13 and diodes 14 whose terminals are inserted into plastic foam strips 10c and 10d where the resistors, integrated circuit chips and diodes are held securely and isolated from other electronic components until needed by the technician.

FIGS. 3 and 4 illustrate the technique of inserting the terminals of a conventional resistor or capacitor into two spaced apart plastic strips. The midpoint of resistor 12 is grasped between the thumb and first finger and one of the lead terminals 12a of resistor 12 is pushed into the wall of strip 10c as shown in FIG. 3. Then the other lead terminal 12b of resistor 12 is pushed into the wall of strip 10d as shown in FIG. 4. Since a portion of terminals 12a and 12b are exposed, it is possible to electrically test reistor 12 without removing it from package 10.

While my preferred emboldiment shown in FIGS. 1-5 contains three foam plastic strips for storing electronic components, my package may contain as little as two or as many as ten plastic strips. FIG. 6 is a partially broken away top plan view of a package 10 containing a flat backing sheet 10a and a plurality of electronic component receiving strips 10b, 10c and 10a which illustrates that my package may contain almost any number of component receiving strips.

While I have shown and described preferred embodiments of my unique package, such description should not be regarded as limiting the scope and spirit of my invention which is limited only by the appended claims.

I claim:

1. A package for storing and transporting a plurality of small electronic components comprising
    a rectangular backing sheet having flat upper and lower surfaces and a plurality of similar spaced apart and parallel strips projecting from the upper surface of the backing sheet for holding a plurality of individual electronic components in fixed positions isolated from other electronic components,
    said package being formed of a flexible plastic foam,
    the parallel strips of plastic foam being so sized and shaped to permit the entire package to be rolled up into an elongated cylinder, and
    a strap for encircling the middle of the package in its rolled up cylindrical form and locking the package in its rolled up form.

2. A package as set forth in claim 1 in which the package is formed of flexible polyurethane foam.

3. A package as set forth in claim 1 in which the package is formed of flexible polyurethane foam loaded with a conductive material.

* * * * *